(12) United States Patent
Misu

(10) Patent No.: US 9,166,544 B2
(45) Date of Patent: Oct. 20, 2015

(54) VOLUME CONTROL APPARATUS WITH FIRST AND SECOND CONTROLLERS

(75) Inventor: Yoshio Misu, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 710 days.

(21) Appl. No.: 13/459,294

(22) Filed: Apr. 30, 2012

(65) Prior Publication Data

US 2013/0058501 A1   Mar. 7, 2013

(30) Foreign Application Priority Data

Sep. 5, 2011  (JP) ................ 2011-192248

(51) Int. Cl.
*H03G 3/00* (2006.01)
*H03G 3/10* (2006.01)
*H03G 3/30* (2006.01)

(52) U.S. Cl.
CPC . *H03G 3/10* (2013.01); *H03G 3/301* (2013.01)

(58) Field of Classification Search
CPC .......... H03G 3/00; H03G 3/02; H03G 3/001; H03G 3/20; H03G 11/00
USPC ............................ 381/56, 102, 104–109, 120
See application file for complete search history.

(56) References Cited

U.S. PATENT DOCUMENTS

| | | | | |
|---|---|---|---|---|
| 5,046,107 A | * | 9/1991 | Iwamatsu | 381/107 |
| 5,127,058 A | * | 6/1992 | Yamasaki et al. | 381/102 |
| 5,677,962 A | * | 10/1997 | Harrison et al. | 381/109 |
| 6,061,455 A | * | 5/2000 | Hadley et al. | 381/57 |
| 2006/0256977 A1 | * | 11/2006 | Xiao | 381/94.1 |

FOREIGN PATENT DOCUMENTS

JP   2010-109845   5/2010

* cited by examiner

*Primary Examiner* — Joseph Saunders, Jr.
*Assistant Examiner* — James Mooney
(74) *Attorney, Agent, or Firm* — Renner, Otto, Boisselle & Sklar, LLP

(57) ABSTRACT

When the instruction for increasing the volume level is input by the user's operation and the signal representing the set value or more is output from a detector, a controller does not increase the volume levels of the first volume controller and the second volume controller. When the signal representing the set value or more is not output from the detector and the second volume level has a predetermined value, the controller increases the first volume level. When the signal representing the set value or more is not output from the detector and the second volume level is less than the predetermined value, the controller increases the second volume level.

3 Claims, 6 Drawing Sheets

VOLUME CONTROL APPARATUS WITH FIRST AND SECOND CONTROLLERS

BACKGROUND OF THE INVENTION

1. Field of the Invention

The present invention relates to a volume control apparatus.

2. Description of the Related Art

In audio amplifiers, when an analog audio signal is input into a DSP, in the DSP, (1) a volume is controlled to a first volume level by a first volume controller, (2) the analog audio signal is converted into a digital audio signal by an analog-digital converter, (3) the digital audio signal is subject to a signal process, (4) a volume is controlled to a second volume level by a second volume controller, and the signal is output to an amplifier. When a sensitivity is set to 2 V, the volume level of the first volume controller is set to −6 dB. This is because since a maximum input voltage of the analog-digital converter in the DSP is 1 V, an analog audio signal of 2 V is reduced to 1 V so as to be input into the analog-digital converter. At this time, since the volume level of the first volume controller is set to −6 dB, the volume level cannot be sufficiently increased for the analog audio signal of 1 V. On the other hand, when the sensitivity is set to 1 V, since the analog audio signal of 1 V can be input directly into the analog-digital converter, the volume level of the first volume controller is set to 0 V. As a result, the volume level can be sufficiently adjusted for the analog audio signal of 1 V. At this time, overflow occurs in the analog audio signal of 2 V, and a noise is generated. In order to solve this problem, conventional audio amplifiers employ a function for manually controlling a sensitivity by means of a user's operation according to an analog audio signal to be input, but it is very complicated that the sensitivity is adjusted by a user's operation.

SUMMARY OF THE INVENTION

It is an object of the present invention to provide a volume control apparatus capable of setting a sensitivity to an optimum value without requiring a user's operation.

A volume control apparatus of the preferred embodiment of the present invention comprises: a first volume controller for controlling a volume level of an analog audio signal to be input to a first volume level set by a controller; an analog-digital converter for converting the analog audio signal from the first volume controller into a digital audio signal; a second volume controller for controlling a volume level of the digital audio signal from the analog-digital converter to a second volume level set by the controller; an amplifier for amplifying an audio signal from the second volume controller; a detector for detecting whether the audio signal output from the amplifier has a set value or more, and when determining as being the set value or more, outputting a signal representing the set value or more to the controller; an input section into which an instruction for increasing a volume level is input by a user's operation; and the controller for, when the instruction for increasing the volume level is input by the user's operation and the signal representing the set value or more is output from the detector, not increasing the volume levels of the first volume controller and the second volume controller, and when the signal representing the set value or more is not output from the detector and the second volume level has a predetermined value, increasing the first volume level, and when the signal representing the set value or more is not output from the detector and the second volume level is less than the predetermined value, increasing the second volume level.

When an instruction for increasing a volume level is input by a user's operation, the second volume level is increased until the second volume level of the second volume controller reaches the predetermined value. After the second volume level of the second volume controller reaches the predetermined value, the first volume level of the first volume controller is increased so that the sensitivity is increased. As a result, the sensitivity is first set to a high value so that clip is prevented, and when the second volume level reaches the predetermined value, the first volume level is increased according to the increase in the volume level so that the sensitivity is reduced. Therefore, even when a low voltage is input, an amplitude value of an output voltage of an amplifier can be made to be large. Further, a signal from a detector is always monitored, and when the signal from the detector is a signal representing the set value or more, the volume level is not increased, thereby preventing the amplitude of an audio signal from the amplifier from being clipped.

Preferably when the signal representing the set value or more is output from the detector according to a level change in an analog audio signal to be input, in a case that the first volume level has a second predetermined value, the controller reduces the second volume level, and in a case that the first volume level is larger than the second predetermined value, the controller reduces the first volume level.

Even when the instruction for increasing the volume level is not input by the user's operation, the voltage of an analog audio signal to be input becomes large and the signal representing the set value or more is output from the detector, the first volume level of the first volume controller is reduced (namely, the sensitivity is increased) until the first volume level has the predetermined value, and when the first volume level has the predetermined value, the second volume level of the second volume controller is reduced.

A volume control apparatus of the other preferred embodiment of the present invention comprises: a first volume controller for controlling a volume level of an analog audio signal to be input to a first volume level set by a controller; an analog-digital converter for converting the analog audio signal from the first volume controller into a digital audio signal; a second volume controller for controlling a volume level of the digital audio signal from the analog-digital converter to a second volume level set by the controller; an amplifier for amplifying an audio signal from the second volume controller; a detector for detecting whether the audio signal output from the amplifier has a set value or more, and when determining as being the set value or more, outputting a signal representing the set value or more to the controller; an input section into which an instruction for controlling the volume level is input by the user's operation; and the controller for, when a signal representing the set value or more is output from the detector according to a level change in the analog audio signal, in a case that the first volume level is a second predetermined value, reducing the second volume level, and in a case that the first volume level is larger than the second predetermined value, reducing the first volume level.

When the instruction for increasing the volume level is not input by the user's operation, a voltage of an analog audio signal to be input becomes high and the signal representing the set value or more is output from the detector, the first volume level of the first volume controller is reduced (namely, the sensitivity is increased) until the first volume level reaches the predetermined value, and when the first volume level has the predetermined value, the second volume level of the second volume controller is reduced.

DETAILED DESCRIPTION OF THE PREFERRED EMBODIMENTS

Figure 1:
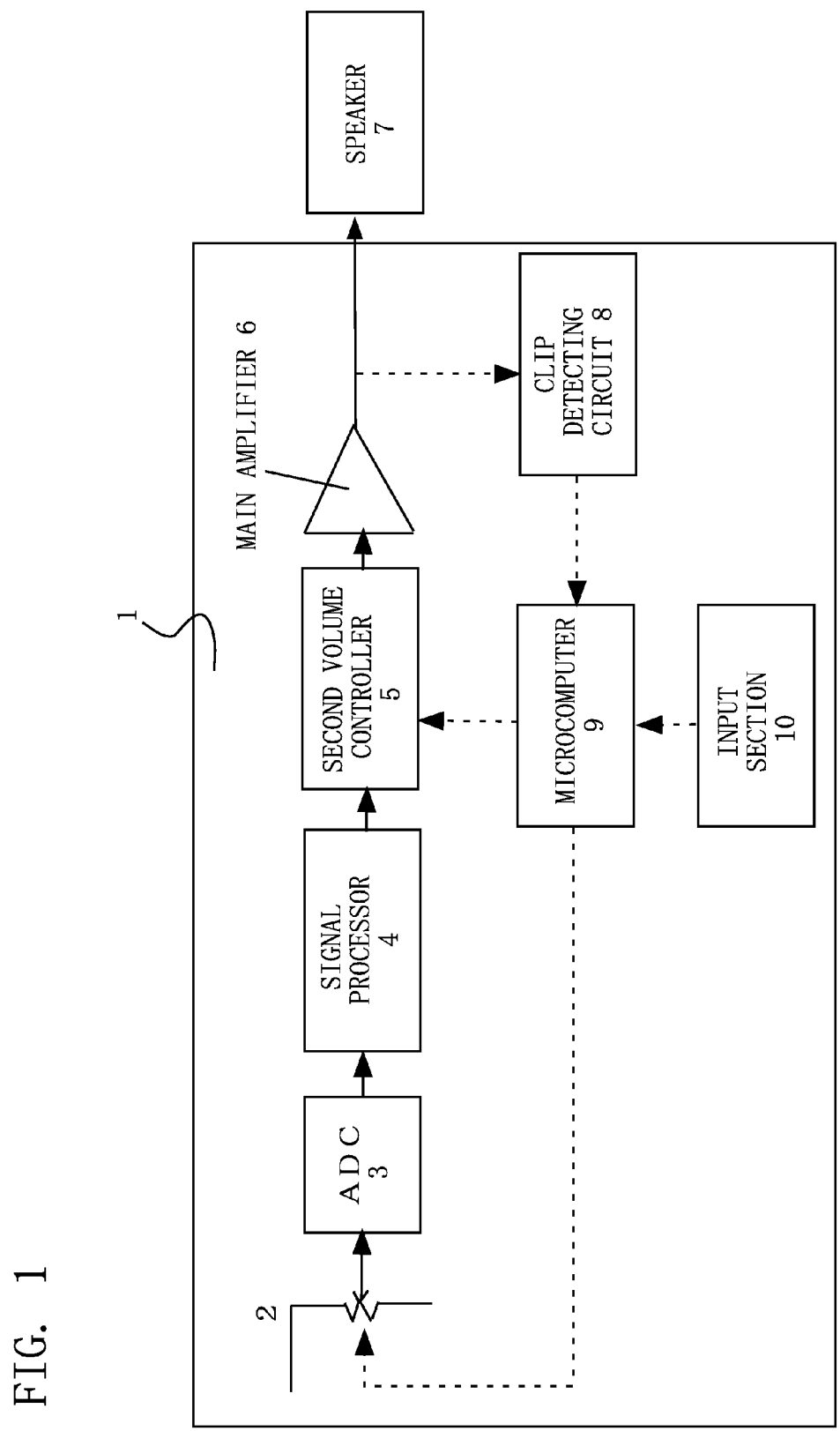
FIG. 1 is a block diagram illustrating a volume control apparatus according to a preferred embodiment of the present invention.

A preferred embodiment of the present invention will be concretely described below with reference to the drawings, but the present invention is not limited to the embodiment. FIG. 1 is a schematic block diagram illustrating an amplifying apparatus 1 having a function of a volume control apparatus according to the preferred embodiment of the present invention. The amplifying apparatus 1 roughly includes a first volume controller 2, an analog-digital converter (hereinafter, referred to as ADC) 3, a signal processor 4, a second volume controller 5, a main amplifier 6, a speaker 7, a clip detecting circuit 8, a microcomputer (controller) 9, and an input section 10. The first volume controller 2, the ADC 3, the signal processor 4, and the second volume controller 5 are constituted by a DSP.

The first volume controller 2 controls a volume level of an analog audio signal input from an outside of the amplifying apparatus 1 to a first volume level set by the microcomputer 9, and outputs the analog audio signal to the ADC 3. The ADC 3 converts the analog audio signal supplied from the first volume controller 2 into a digital audio signal, and supplies the digital audio signal to the signal processor 4.

A maximum input voltage of the ADC 3 is determined to, for example, 1 V (hereinafter, RMS (root mean square). Therefore, in order that a sensitivity is set to, for example, 2 V (RMS) and the analog audio signal of 2V (RMS) is input into the ADC 3, a volume level of the first volume controller 2 should be set to −6 dB. As a result, an analog audio signal of 2 V is reduced to 1 V by the first volume controller 2 so as to be capable of being input into the ADC 3. Further, for example, when the sensitivity is set to 1 V and an analog audio signal of 1 V is input into the ADC 3, the volume level of the first volume controller 2 is set to 0 dB.

The signal processor 4 executes a signal process on the digital audio signal supplied from the ADC 3, and supplies the signal to the second volume controller 5. The signal process is an acoustic signal process such as a boost process, a cutting process and an equalizer process.

The second volume controller 5 controls a volume level of the digital audio signal supplied from the signal processor 4 to a second volume level set by the microcomputer 9, and supplies the digital audio signal to the main amplifier 6. The main amplifier 6 amplifies the digital audio signal supplied from the second volume controller 5, and supplies an analog audio signal to the speaker 7. As the main amplifier 6, a switching amplifier is adopted. The switching amplifier has an LPF (low-pass filter) at its later stage, and supplies an analog audio signal from which a high-frequency component is eliminated in the LPF to the speaker 7.

The clip detecting circuit 8 detects whether an audio signal output from the main amplifier 6 has a set value or more. When the determination is made as being the set value or more, a signal representing the setting value or more (for example, a low-level signal) is output to the microcomputer 9.

The clip detecting circuit 8 detects an amplitude value of the analog audio signal supplied from the main amplifier 6, and when the analog audio signal is clipped, it outputs a signal representing that clip is carried out to the microcomputer 9. More specifically, the clip detecting circuit 8 detects whether the amplitude value of the analog audio signal has a set value or more. When the amplitude value is the set value or more, the clip detecting circuit 8 outputs a signal representing that the amplitude value is the set value or more to the microcomputer 9. On the other hand, when the amplitude value is less than the set value, the clip detecting circuit 8 outputs a signal representing that the amplitude value is less than the set value.

Figure 2:
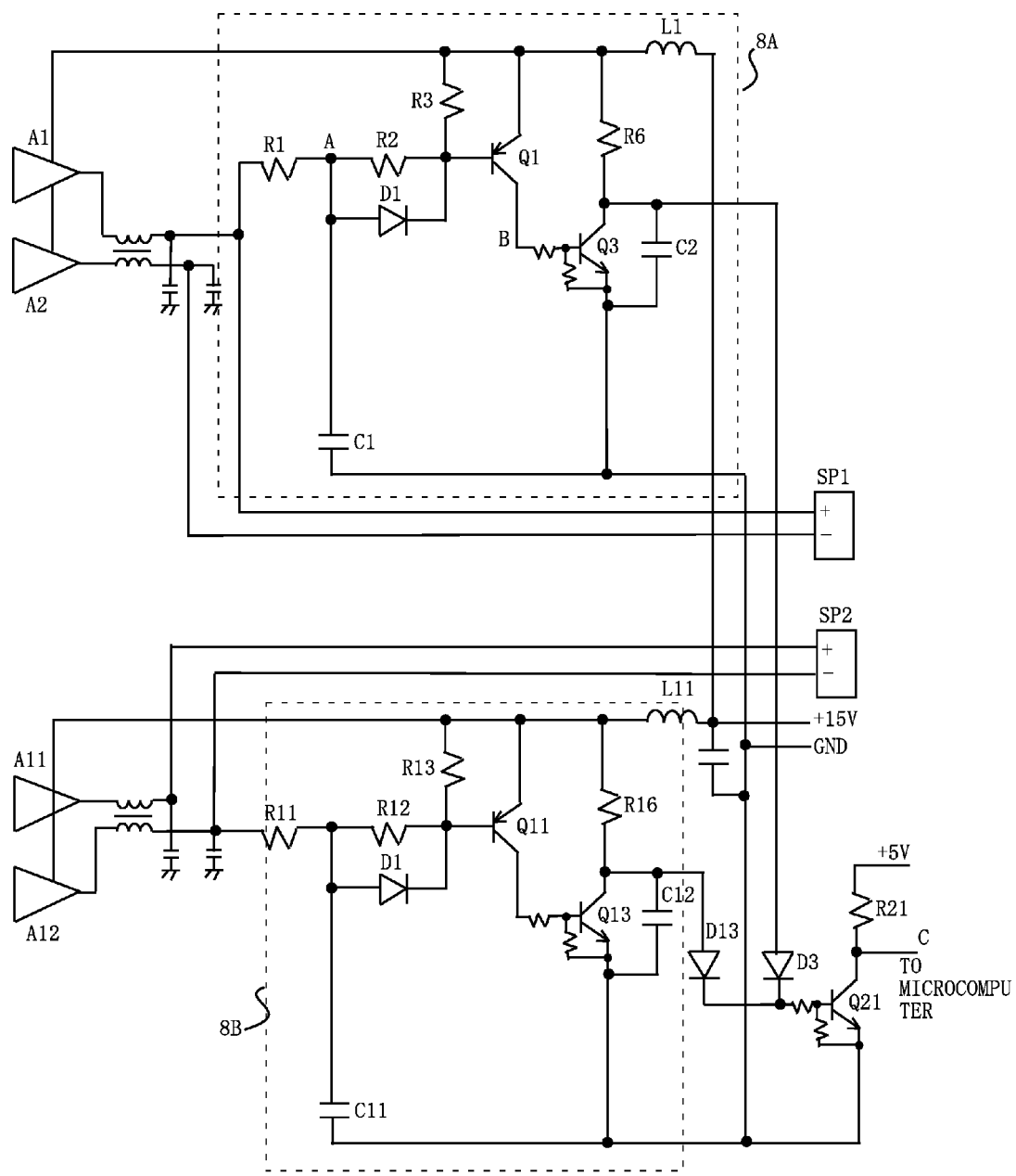
FIG. 2 is a circuit diagram illustrating a clip detecting circuit.

FIG. 2 is a circuit diagram illustrating the main amplifier 6, the clip detecting circuit 8, and the speaker 7. When the analog audio signal is 2 ch signals including a left-channel audio signal and a right-channel audio signal, the clip detecting circuit 8 includes a clip detecting circuit 8A for left channel and a clip detecting circuit 8B for right channel. The main amplifier 6 also includes amplifiers for left channel A1 (a positive amplifier) and A2 (negative amplifier), and amplifiers for right channel A11 (positive amplifier) and A12 (negative amplifier). An analog audio signal from the amplifier for left channel A1 is input into a positive input terminal of a left speaker SP1, and an analog audio signal from the amplifier for left channel A2 is input into a negative input terminal of the left speaker SP1. The analog audio signal from the amplifier for left channel A1 is input into the clip detecting circuit 8A for left channel. An analog audio signal from the amplifier for right channel A11 is input into a positive input terminal of a right speaker SP2, and an analog audio signal from the amplifier for right channel A12 is input into a negative input terminal of the right speaker SP2. Further, the analog audio signal from the amplifier for right channel A12 is input into the clip detecting circuit 8B for right channel.

Since the clip detecting circuit for left channel 8A and the clip detecting circuit for right channel 8B have the same circuit configuration, only the clip detecting circuit for left channel 8A will be described below.

The clip detecting circuit 8A schematically includes resistors R2 and R3 for determining set values, a first detector (transistor Q1) for detecting whether an amplitude value of an output voltage of the main amplifier 6 is a set value or more, and an output section (transistor Q3) for outputting a detected result of the first detector.

The transistor Q1 is a pnp type transistor. An emitter of the transistor Q1 is connected to a +15 V power supply line, a collector is connected to a base of the transistor Q3, and a base is connected to a connecting point between the resistor R2 and the resistor R3. The transistor Q3 is an npn type transistor containing a resistor. A base of the transistor Q3 is connected to a collector of the transistor Q1, and a collector is connected to the +15 V power supply line via a resistor R6.

A transistor Q21 is for supplying a signal representing that an audio signal is clipped to the microcomputer 9 when at least one of a signal from the clip detecting circuit for left channel 8A and a signal from the clip detecting circuit for right channel 8B is the signal representing an audio signal is clipped.

With reference to FIG. 1, the input section 10 is a volume control knob or a remote controller for accepting user's operations. The input section 10 accepts an instruction for controlling (increasing or reducing) the volume level according to a user's operation, and supplies the instruction to the microcomputer 9.

When the instruction for increasing the volume level is input into the microcomputer 9 by the user's operation, the microcomputer 9 determines whether a signal representing a set value or more is output from the clip detecting circuit 8. When the signal representing the set value or more is output from the clip detecting circuit 8, the microcomputer 9 does not increase the volume levels of the first volume controller 2 and the second volume controller 5 any more. Therefore, an output voltage of the main amplifier 6 can be prevented from being clipped.

When the instruction for increasing the volume level is input by the user's operation, the signal representing the set value or more is not output from the clip detecting circuit 8 and the second volume level of the second volume controller 5 is less than a predetermined value (for example, −6 dB when the sensitivity is 2 V), the microcomputer 9 makes a control so that the second volume controller 5 raises the second volume level.

When the instruction for increasing the volume level is input by the user's operation, the signal representing the set value or more is not output from the clip detecting circuit 8 and the second volume level of the second volume controller 5 is a predetermined value (for example, −6 dB when the sensitivity is 2 V), the microcomputer 9 makes a control so that the first volume controller 2 increases the first volume level. The increase in the first volume level of the first volume controller 2 corresponds to the reducing of the sensitivity.

Figure 3:
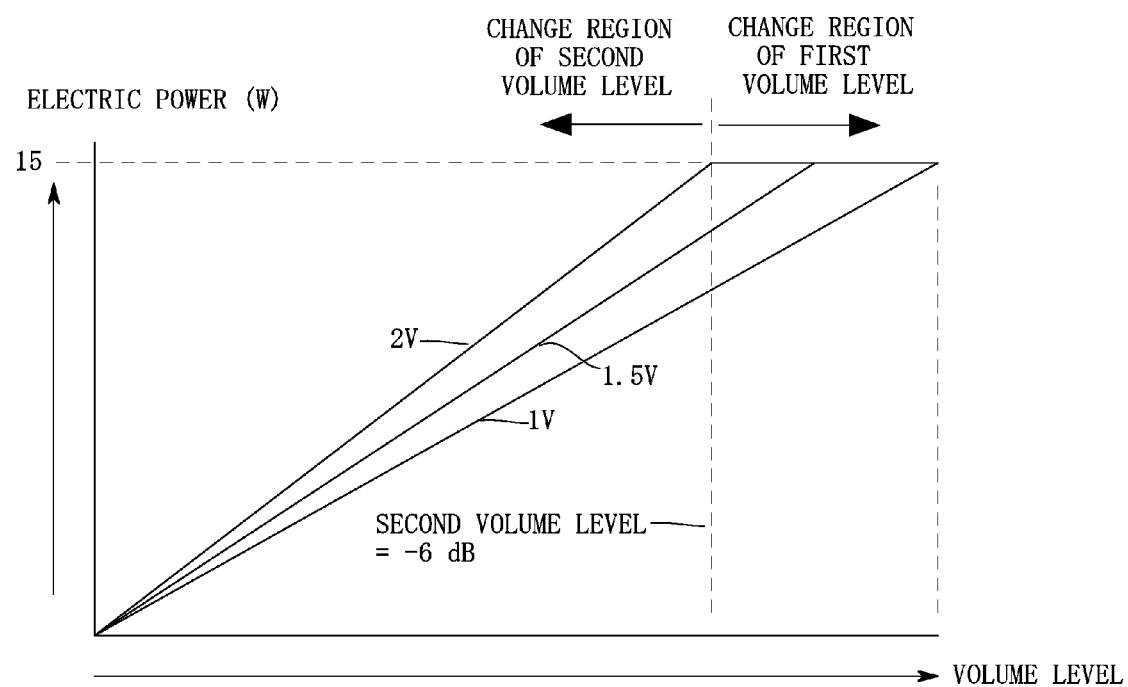
FIG. 3 is a diagram illustrating a relationship between a volume level and an electric power.

FIG. 3 is a diagram illustrating an output power of the main amplifier 6 with respect to the volume level (an abscissa axis) set by the user's operation. FIG. 3 illustrates a change in the power with respect to the volume level when the analog audio signal to be input into the first volume controller 2 is 1 V, 1.5 V and 2 V. Further, in FIG. 3, a change in the second volume level of the second volume controller 5 is shown until the second volume level reaches −6 dB, and after the second volume level reaches −6 dB, a change in the first volume level of the first volume controller 2 (the change in the sensitivity) is shown. The clip detecting circuit 8 outputs a signal representing clip (low-level signal) at power of 15 W, thereby preventing the volume level from rising any more.

When the clip detecting circuit 8 outputs the signal representing the set value or more due to a level change in the analog audio signal to be input and the first volume level of the first volume controller 2 is larger than a second predetermined value (for example, −6 dB when the sensitivity is 2 V), the microcomputer 9 reduces the first volume level of the first volume controller 2. That is to say, the sensitivity is increased.

When the signal representing the set value or more is output from the clip detecting circuit 8 due to a level change in the analog audio signal to be input and the first volume level of the first volume controller 2 is the second predetermined value (for example, −6 dB), the microcomputer reduces the second volume level of the second volume controller 5.

An operation of the present invention will be described below. An operation of the clip detecting circuit 8 will be first described.

Figure 4:
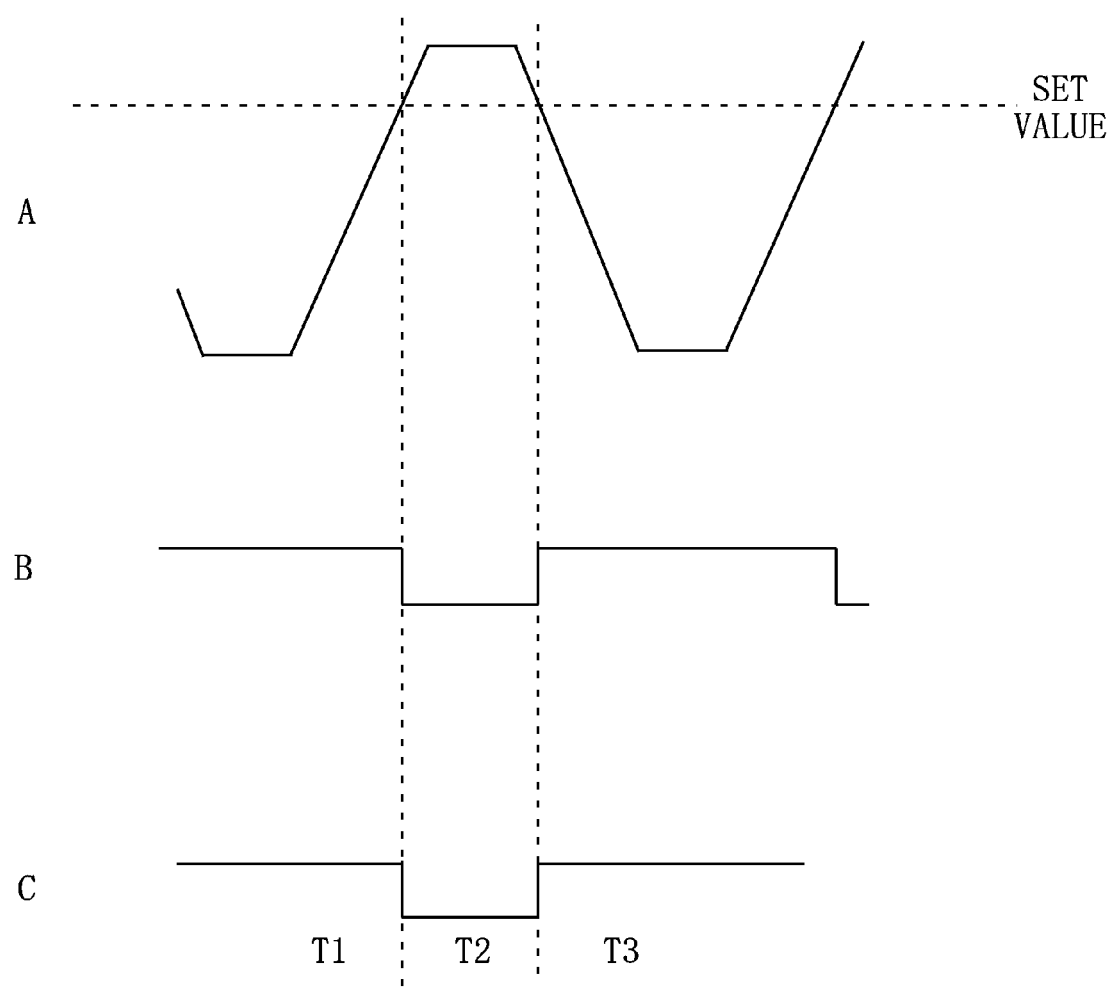
FIG. 4 is a time chart illustrating voltage waveforms of respective sections in the clip detecting circuit 8.

FIG. 4 is a time chart illustrating waveforms at respective points of the clip detecting circuit 8A, and respective alphabets correspond to the waveforms at the respective points in FIG. 2. Much the same is true on an operation of the clip detecting circuit for right channel 8B. The clip detecting circuit for right channel 8B does not detect that an audio signal is the set value or more, and thus a collector voltage of a transistor Q13 is at low level, and a signal is not output to a base of the transistor Q21.

At period T1, the amplitude value of the output voltage from the main amplifier 6 is less than the set value (see the voltage at point A). Therefore, a base voltage of the transistor Q1 reaches a conduction start voltage, namely, in an on state, and a collector voltage is increased to a +15 V power supply voltage so that a voltage at point B is at high level. Since a voltage at point B of the transistor Q3 is at high level, a base voltage reaches a conduction start voltage and is in an on state, and a collector voltage is reduced to a ground potential. A base voltage of the transistor Q21 is less than a conduction start voltage, and transistor Q21 is in an off state. Therefore, a +5 V power supply voltage as a high-level signal representing that an audio signal is not clipped is output to the microcomputer 9. That is to say, a voltage at point C is at high level.

At period T2, the amplitude value of the output voltage from the main amplifier 6 is the set value or more (see the voltage at point A). That is to say, the amplitude of the audio signal is considered to be clipped. The base voltage of the transistor Q1 does not reach the conduction start voltage and transistor Q1 is in an off state, and a collector is in an open state with respect to the +15 V power supply voltage, and a voltage at point B is at low level. Since the voltage at point B is at low level, a base voltage of the transistor Q3 does not reach the conduction start voltage and transistor Q3 is in an off state, and the collector voltage is increased to the +15 V power supply voltage. The collector voltage of the transistor Q3 is supplied to a base of the transistor Q21 via a diode D3. The base voltage of the transistor Q21 reaches the conduction start voltage, and transistor Q21 is in an on state. Therefore, a ground potential as a low-level signal representing that the audio signal is clipped (the amplitude of the audio signal is the set value or more) is output to the microcomputer 9. That is to say, a voltage at point C is at low level.

At period T3, since the state is same as the period T1, the description about period T1 is employed.

An operation of the microcomputer 9 will be described below.

Figure 5:
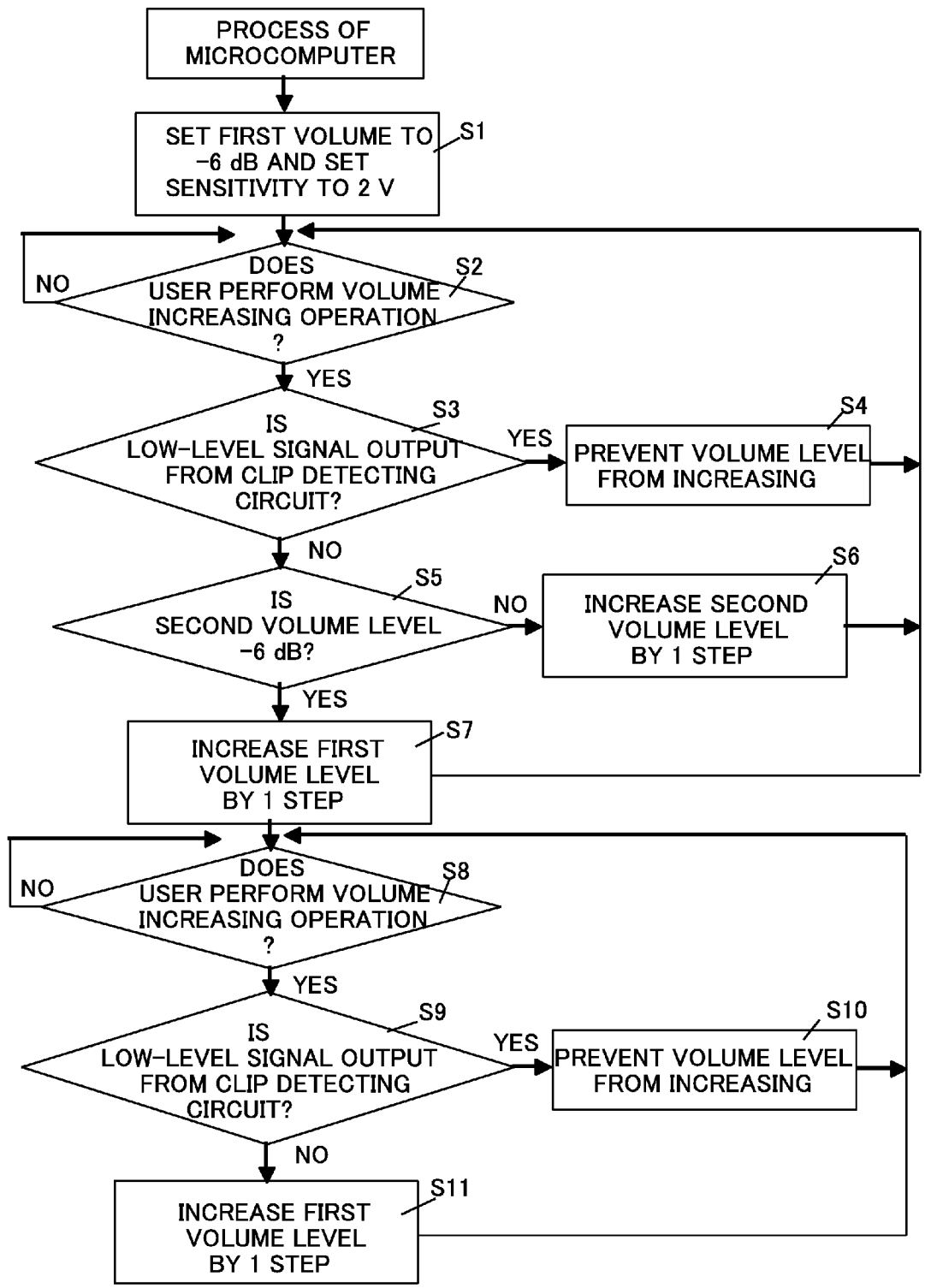
FIG. 5 is a flowchart illustrating a process of a microcomputer (controller) 9.

FIG. 5 is a flowchart illustrating a process of the microcomputer 9 when the instruction for increasing the volume level is input by the user's operation. The microcomputer 9 sets the first volume level of the first volume controller 2 to −6 dB. Therefore, it means that the sensitivity is set to 2 V. Thereafter, the microcomputer 9 determines whether the instruction for increasing the volume level is input by the user's operation (S2).

When the instruction for increasing the volume level is input (YES at S2), the microcomputer 9 determines whether a low-level signal is output from the clip detecting circuit 8 (S3). That is to say, when the amplitude value of the output voltage from the main amplifier 6 is the set value or more and the volume level is increased furthermore, the microcomputer 9 determines whether the amplitude of the audio signal is clipped. When the low-level signal is output from the clip detecting circuit 8 (YES at S3), the microcomputer 9 prevents the volume levels of the first volume controller 2 and the second volume controller 5 from increasing any more. That is to say, the instruction for increasing the volume levels from the user is disabled.

On the other hand, when a high-level signal is output from the clip detecting circuit 8 (NO at S3), the microcomputer 9 determines whether the second volume level of the second volume controller 5 is −6 dB (when the sensitivity is 2 V) (S5, see a broken line in FIG. 3). When the second volume level is less than −6 dB (NO at S5), the microcomputer 9 increases the second volume level of the second volume controller 5 by a predetermined step (for example, 1 step=1 dB) (S6). This process corresponds to a change in the power waveform of a portion described as "a change region of the second volume level" in FIG. 3. The process returns to S2.

On the other hand, when the second volume level is −6 dB (YES at S5), the microcomputer 9 does not increase the second volume level any more, and instead increases the first volume level of the first volume controller 2 by a predetermined step (for example, 1 step=1 dB) (S7). To increase the first volume level means to reduce the sensitivity. The second volume level is increased to −6 dB maximally because when the sensitivity is 2 V and the second volume level is increased to be higher than −6 dB, the output voltage from the main amplifier 6 is likely to be clipped.

Thereafter, the microcomputer 9 again determines whether the instruction for increasing the volume level is input by the user's operation (S8). When being input (YES at S8), the microcomputer 9 determines whether a low-level signal is output from the clip detecting circuit 8 (S9). That is to say, when the amplitude value of the output voltage from the main amplifier 6 is the set value or more and the volume level is increased furthermore, the determination is made whether the amplitude of the audio signal is clipped. When the low-level signal is output from the clip detecting circuit 8 (YES at S9), the microcomputer 9 does not increase the volume level of the first volume controller 2 any more. That is to say, the instruction for increasing the volume level from the user is disabled.

On the other hand, when a high-level signal is output from the clip detecting circuit 8 (NO at S9), the microcomputer 9 increases the first volume level of the first volume controller 2 by a predetermined step (for example, 1 step=1 dB) (S7). To increase the first volume level means to reduce the sensitivity. This process corresponds to a change in the power waveform of a portion described as "a change region of the first volume level" in FIG. 3. Then, the process returns to S8. Therefore, at S8 to S11, the first volume level is not clipped and is sequentially increased as high as possible, and the sensitivity is, then, sequentially reduced.

When the instruction for increasing the volume level is input by the user's operation, the second volume level is increased until the second volume level of the second volume controller 5 reaches −6 dB (when the sensitivity is 2 V). After the second volume level of the second volume controller 5 reaches −6 dB (when the sensitivity is 2 V), the first volume level of the first volume controller 2 is increased so that the sensitivity is increased. As a result, the sensitivity is first set to a high value 2 V, so that clip is prevented, and when the second volume level reaches −6 dB, the first volume level is increased so that the sensitivity is reduced according to the increase in the volume level. In this case, even when a low voltage is input, the amplitude value of the output voltage from the main amplifier 6 can be heightened. Further, when signals from the clip detecting circuit 8 are always monitored and a signal from the clip detecting circuit 8 is at low level, the volume level is not increased, thereby preventing the amplitude of the audio signal from the main amplifier 6 from being clipped.

Figure 6:
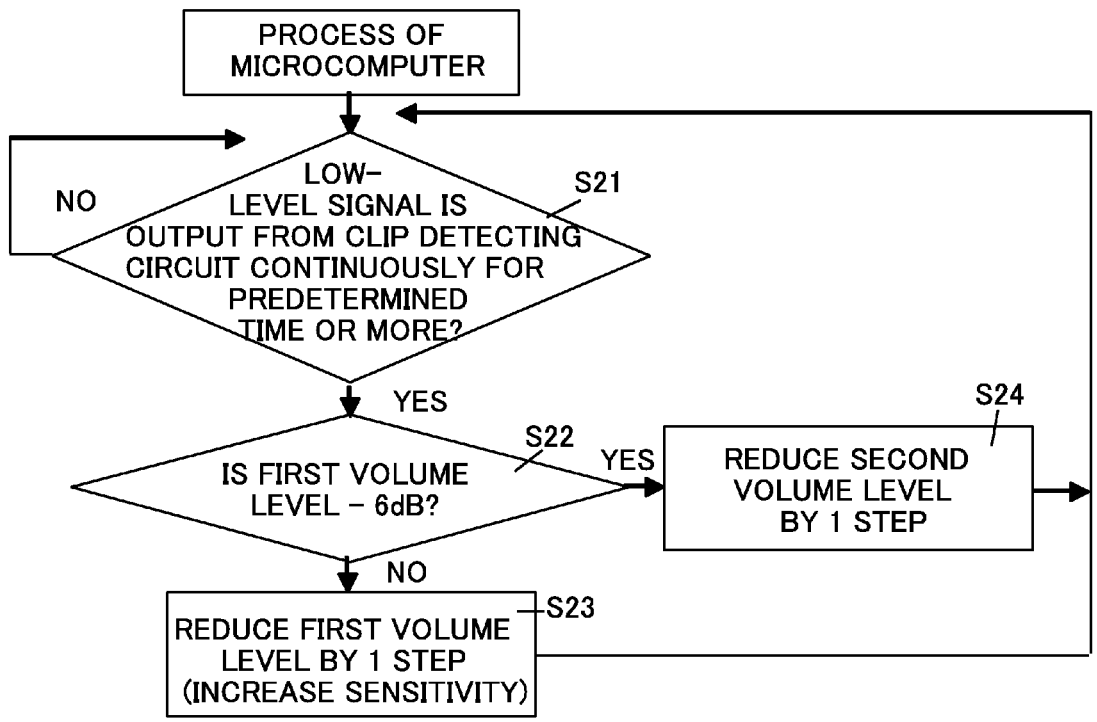
FIG. 6 is a flowchart illustrating the process of the microcomputer (controller) 9.

FIG. 6 illustrates a process of the microcomputer 9 in a situation that when the instruction for increasing the volume level is not input by the user, a voltage of an analog audio signal to be input into the first volume controller 2 becomes high and, thus, a low-level signal is output from the clip detecting circuit 8.

The microcomputer 9 determines whether signals representing that an audio signal is clipped (a low-level signal) are received continuously from the clip detecting circuit 8 for predetermined time (5 milliseconds or more) (S21). The determination may be made not whether the low-level signals are detected continuously for predetermined time but whether the low-level signals are detected at least for only a moment.

When the low-level signals are received continuously for the predetermined time (YES at S21), the microcomputer 9 determines whether the volume level of the first volume controller 2 is −6 dB (S22). That is to say, the determination is made whether the sensitivity is set to the maximum value 2V. When the first volume level is not −6 dB (NO at S22), the microcomputer 9 reduces the first volume level of the first volume controller 2 by a predetermined step (for example, 1 step=1 dB) (S23). That is to say, the sensitivity is increased.

On the other hand, when the first volume level is −6 dB (YES at S22), namely, the sensitivity has the maximum value 2 V, the microcomputer 9 reduces the second volume level of the second volume controller 5 by a predetermined step (for example, 1 step=1 dB) (S24).

According to the above process, when the instruction for increasing the volume level is not input by the user's operation, a voltage of an analog audio signal to be input becomes high and a low-level signal is output from the clip detecting circuit 8, the microcomputer 9 reduces the first volume level of the first volume controller 2 until the first volume level reaches −6 dB (namely, the sensitivity is increased), and when the first volume level is −6 dB, the second volume level of the second volume controller 5 is reduced.

The preferred embodiment of the present invention is described above, but the present invention is not limited to the embodiment.

What is claimed is:

1. A volume control apparatus, comprising:
  a first volume controller for controlling a volume level of an analog audio signal to be input to a first volume level set by a main controller;
  an analog-digital converter for converting the analog audio signal from the first volume controller into a digital audio signal;
  a second volume controller for controlling a volume level of the digital audio signal from the analog-digital converter to a second volume level set by the main controller;
  an amplifier for amplifying an audio signal from the second volume controller;
  a detector for detecting whether the audio signal output from the amplifier has a set value or more, and when determining as being the set value or more, outputting a signal representing the set value or more to the main controller;
  an input section into which an instruction for increasing a volume level is input by a user's operation; and
  the main controller for, when the instruction for increasing the volume level is input by the user's operation and the signal representing the set value or more is output from the detector, not increasing the volume levels of the first volume controller and the second volume controller, and when the signal representing the set value or more is not output from the detector and the second volume level has a predetermined value, increasing the first volume level, and when the signal representing the set value or more is not output from the detector and the second volume level is less than the predetermined value, increasing the second volume level.

2. The volume control apparatus according to claim 1, wherein when the signal representing the set value or more is output from the detector according to a level change in an analog audio signal to be input, in a case that the first volume level is a second predetermined value, the main controller reduces the second volume level, and in a case that the first volume level is larger than the second predetermined value, the main controller reduces the first volume level.

3. A volume control apparatus, comprising:
   a first volume controller for controlling a volume level of an analog audio signal to be input to a first volume level set by a main controller;
   an analog-digital converter for converting the analog audio signal from the first volume controller into a digital audio signal;
   a second volume controller for controlling a volume level of the digital audio signal from the analog-digital converter to a second volume level set by the main controller;
   an amplifier for amplifying an audio signal from the second volume controller;
   a detector for detecting whether the audio signal output from the amplifier has a set value or more, and when determining as being the set value or more, outputting a signal representing the set value or more to the main controller;
   an input section into which an instruction for controlling the volume level is input by the user's operation; and
   the main controller for, when a signal representing the set value or more is output from the detector according to a level change in the analog audio signal, in a case that the first volume level is a second predetermined value, reducing the second volume level, and in a case that the first volume level is larger than the second predetermined value, reducing the first volume level.

* * * * *